United States Patent
Sri et al.

(10) Patent No.: US 11,181,581 B2
(45) Date of Patent: Nov. 23, 2021

(54) SWITCHING LOSS MEASUREMENT AND PLOT IN TEST AND MEASUREMENT INSTRUMENT

(71) Applicant: TEKTRONIX, INC., Beaverton, OR (US)

(72) Inventors: Krishna N H Sri, Bangalore (IN); Gajendra Kumar Patro, Bangalore (IN); Abhinav Bal, Durgapur (IN); Gurushiddappa M N, Dharwad (IN)

(73) Assignee: TEKTRONIX, INC., Beaverton, OR (US)

( * ) Notice: Subject to any disclaimer, the term of this patent is extended or adjusted under 35 U.S.C. 154(b) by 761 days.

(21) Appl. No.: 14/257,845

(22) Filed: Apr. 21, 2014

(65) Prior Publication Data

US 2015/0032393 A1   Jan. 29, 2015

(30) Foreign Application Priority Data

Jul. 26, 2013   (IN) ............................ 2485MUM2013

(51) Int. Cl.
  *G01R 31/327*   (2006.01)
  *G01R 13/02*   (2006.01)
  (Continued)

(52) U.S. Cl.
  CPC ....... *G01R 31/327* (2013.01); *G01R 13/0236* (2013.01); *G01R 31/26* (2013.01);
  (Continued)

(58) Field of Classification Search
  None
  See application file for complete search history.

(56) References Cited

U.S. PATENT DOCUMENTS 3,246,177 A * 4/1966 Schroeder ............... H01L 29/00
                                                    257/401
3,278,760 A * 10/1966 Wagner .................. H03K 3/315
                                                    327/193
(Continued)

FOREIGN PATENT DOCUMENTS

EP    0702235 A1 *  3/1996 ........... G01R 13/408
JP    S56128466 A    10/1981
(Continued)

OTHER PUBLICATIONS

*Electric Power Group* v. *Alstom* (Case Attached).*
(Continued)

*Primary Examiner* — Catherine T. Rastovski
*Assistant Examiner* — Leonard S Liang
(74) *Attorney, Agent, or Firm* — Miller Nash LLP; Andrew J. Harrington (57) ABSTRACT

The disclosed technology relates to a method and apparatus for graphically displaying a switching cycle of a switching device. A switching voltage and a switching current are acquired for a device under test via a voltage probe and a current probe, respectively, for a plurality of switching cycles of the device under test. The switching current versus the switching voltage is plotted on a current versus voltage plot as a curve for each of the switching cycles. Each of the curves on the current versus voltage plot overlap each other and are displayed to a user.

15 Claims, 10 Drawing Sheets

(51) Int. Cl.
*G01R 31/26* (2020.01)
*G01R 35/00* (2006.01)
*G01R 23/16* (2006.01)
*H02M 3/157* (2006.01)

(52) U.S. Cl.
CPC ..... *G01R 31/2601* (2013.01); *G01R 31/2603* (2013.01); *G01R 31/2617* (2013.01); *G01R 23/16* (2013.01); *G01R 35/005* (2013.01); *H02M 3/157* (2013.01)

(56) References Cited

U.S. PATENT DOCUMENTS

| | | | | |
|---|---|---|---|---|
| 4,287,604 | A * | 9/1981 | Gipe | H04B 1/26 455/323 |
| 4,934,775 | A * | 6/1990 | Koai | H04Q 11/0005 385/16 |
| 5,057,760 | A * | 10/1991 | Dadpey | B60L 7/003 318/807 |
| 5,557,718 | A * | 9/1996 | Tsuneyoshi | G06T 11/206 345/440 |
| 5,801,519 | A * | 9/1998 | Midya | G05F 1/67 323/222 |
| 6,876,936 | B2 | 4/2005 | Ramesh et al. | |
| 7,110,897 | B2 | 9/2006 | Nadig et al. | |
| 7,423,446 | B2 * | 9/2008 | Agarwal | G01R 31/2884 324/762.08 |
| 8,482,564 | B2 * | 7/2013 | Nelson | G01R 13/0236 345/440 |
| 9,035,624 | B1 * | 5/2015 | Rahimi | H02M 3/156 323/224 |
| 9,641,099 | B2 * | 5/2017 | Gupta | H02M 7/493 |
| 2001/0012207 | A1 * | 8/2001 | Nomura | H02M 3/33569 363/17 |
| 2005/0017707 | A1 | 1/2005 | Ramesh et al. | |
| 2005/0035966 | A1 * | 2/2005 | Pasquarette | G06F 3/0486 345/440 |
| 2005/0062461 | A1 | 3/2005 | Srikrishna et al. | |
| 2005/0185769 | A1 * | 8/2005 | Pickerd | G01R 35/005 379/30 |
| 2007/0050170 | A1 * | 3/2007 | Noguchi | G01R 31/318511 702/127 |
| 2008/0122543 | A1 * | 5/2008 | Silver | H03F 1/0255 330/297 |
| 2009/0059646 | A1 * | 3/2009 | Takahashi | G11C 11/22 365/145 |
| 2009/0109226 | A1 | 4/2009 | Nelson et al. | |
| 2009/0134880 | A1 * | 5/2009 | Grund | G01R 31/002 324/537 |
| 2012/0018698 | A1 * | 1/2012 | Yang | B82Y 10/00 257/5 |
| 2013/0063171 | A1 * | 3/2013 | Kouno | G01R 31/2886 324/750.25 |
| 2013/0234103 | A1 * | 9/2013 | Yang | H01L 45/10 257/5 |
| 2013/0320959 | A1 * | 12/2013 | Mikata | G01R 25/00 324/76.77 |
| 2014/0117970 | A1 * | 5/2014 | Kitagaki | H02J 1/10 323/318 |

FOREIGN PATENT DOCUMENTS

| | | | | |
|---|---|---|---|---|
| JP | | 2009257997 | 11/2009 | |
| JP | | 2011106827 | 6/2011 | |
| WO | WO-2013132298 | A1 * | 9/2013 | ............ G01R 13/28 |

OTHER PUBLICATIONS

Wikipedia entry for "Hysteresis", snapshot taken using wayback machine on May 10, 2013 (Year: 2013).*

Fuji Electric Co., Ltd. Catalog excerpt—"Chapter 9 Evaluation and Measurement"; As stated on p. 13 of the NPL, "This Catalog contains the product specifications, characteristics, data, materials, and structures as of May 2011") (Year: 2011).*

Tektronix—Advanced Power Analysis Printed Application Help; www.tek.com; 077-0018-09 (NPL Date not explicitly on document, but considered to be 2011, based on the evidence provided by NPL documents V and W below, as discussed in the rejection.) (Year: 2011).*

Automated Power Analysis—DPOPWR video; https://www.tek.com/how-to/automated-power-analysis—dpopwr; May 25, 2011 (Year: 2011).*

MSO5000/DPO5000; https://www.tek.com/oscilloscope/mso5000-dpo5000 (Year: 2011).*

Tektronix Help Document 077-0018-03 (Titled "DPOPWR Power Measurement and Analysis Software") (Year: 2007).*

"Evaluation and Measurement", Chapter 9, Fuji Electric Co., Ltd., May 1, 2011, pp. 9-1-9-13.

"Mixed Signal Oscilloscopes MSO4000 Series, DPO4000 Series Data Sheet", Tektronix, Oct. 28, 2009, pp. 1-20.

Extended European Search Report for European Patent Application No. 14178601.2, dated Dec. 3, 2014, 8 pages, Munich.

Tektronix, Inc., DPOPWR Power Measurement and Analysis Software, Help Document, 5th version, P/N 077-0018-04, Aug. 3, 2010, 243 pages, Tektronix, Inc., Beaverton, OR, USA.

Tektronix, Inc., DPOPWR Advanced Power Analysis, Help Document, 6th version, P/N 077-0018-05, Nov. 15, 2013, 233 pages, Tektronix, Inc., Beaverton, OR, USA.

* cited by examiner

SWITCHING LOSS MEASUREMENT AND PLOT IN TEST AND MEASUREMENT INSTRUMENT

CROSS REFERENCE TO RELATED APPLICATION

This application claims priority to Indian patent application 2485/MUM/2013 filed 26 Jul. 2013, herein incorporated by reference.

TECHNICAL FIELD

The disclosed technology relates to measurement of signals related to switching devices and specifically concerns in-circuit measurements of signals acquired across a switching device by use of a test and measurement device, such as a digital storage oscilloscope (DSO).

BACKGROUND

Power loss is a significant component in overall power consumption of a switching device, such as a switching power supply, and is estimated at 35% to 40%. The power loss has an adverse impact on the performance of the switching power supply by reducing efficiency and reliability, and by causing an increase in the size of a needed heat sink.

In order to know the exact impact, it is important to measure and characterize the total switching loss as well as switching losses during specific switching cycles of the switching device. Currently, only the maximum, minimum and average statistics for all switching cycles can be determined. Unfortunately, there are no currently available test tools in the market to measure a specific switching loss during a specific switching cycle.

SUMMARY

Certain embodiments of the disclosed technology include a method of graphically displaying a switching cycle of a switching device on a test and measurement device. The method includes acquiring from a device under test a switching voltage and a switching current via a voltage probe and a current probe, respectively, for a plurality of switching cycles of the device under test. The switching current and the switching voltage are then plotted on a current versus voltage plot 300 (FIG. 3) as a curve for each of the switching cycles. Each of the curves on the current versus voltage plot 300 overlap each other and are displayed on a display.

Figure 3:
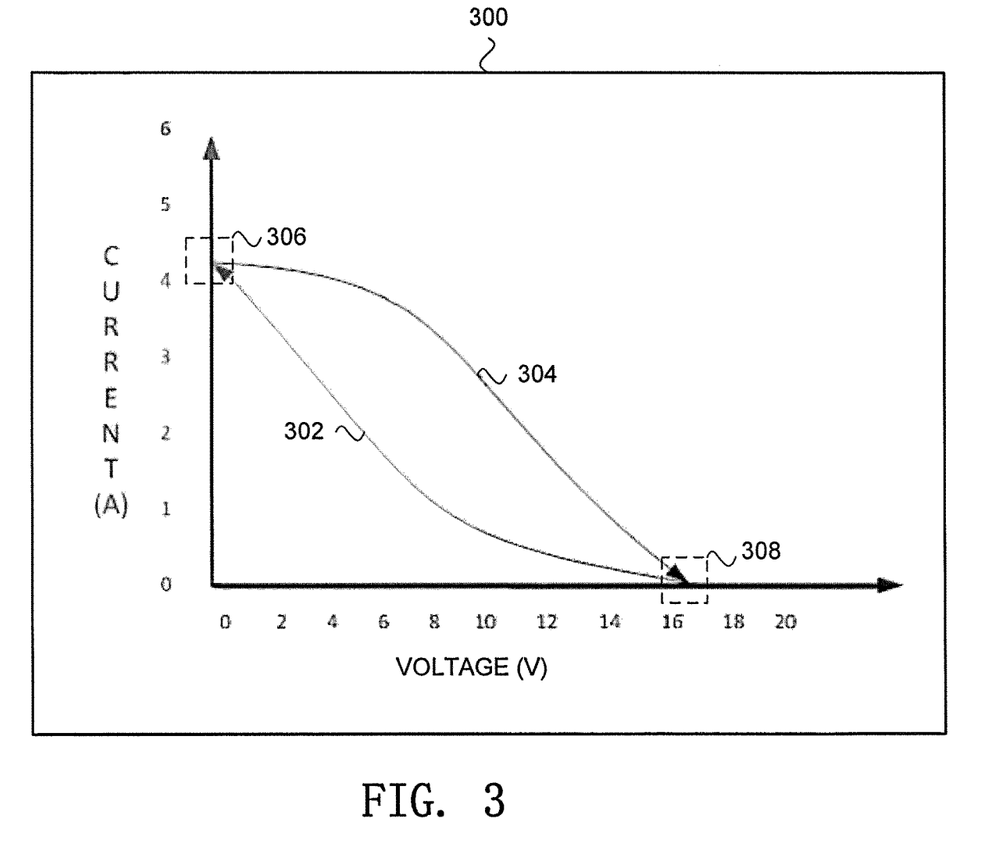
FIG. 3 illustrates an idealized current versus voltage plot of certain embodiments of the disclosed technology.

Certain other embodiments of the disclosed technology include a test and measurement instrument for plotting a current versus voltage plot 300. A voltage probe for acquiring a switching voltage from a device under test and a current probe for acquiring a switching current from the device under test are provided in the test and measurement instrument. The test and measurement instrument also includes an acquisition unit structured to receive the switching voltage and the switching current from the voltage probe and the current probe, a controller structured to plot the switching current versus the switching voltage on a current versus voltage plot 300 as a curve for each of the switching cycles, wherein each of the curves overlap on the current versus voltage plot 300, and a display structured to display the current versus voltage plot 300.

DETAILED DESCRIPTION

In the drawings, which are not necessarily to scale, like or corresponding elements of the disclosed systems and methods are denoted by the same reference numerals.

The subject apparatus and method are used to graphically represent the ON and OFF switching loss of a switching device such as MOSFET, BJT and IGBT in a switching power supply as curves on a current versus voltage plot 300 and calculating the switching loss for specific switching cycles.

The present invention is discussed in terms of a power measurement and analysis software tool, such as DPOPWR produced by Tektronix, Inc. of Beaverton, Ore. The exemplary power-measurement program tool is installed and stored in a local memory of a digitizing test and measurement device, such as a digital storage oscilloscope (DSO) to transform the DSO into an analysis tool that quickly measures and analyzes real-time switching losses in a circuit, such as a transistor of a switching power supply. A DSO implementing the disclosed technology optionally generates detailed test reports in customizable formats. One skilled in the art, however, will appreciate that the teachings discussed herein may be implemented in other digitizing measurement devices.

Figure 1:
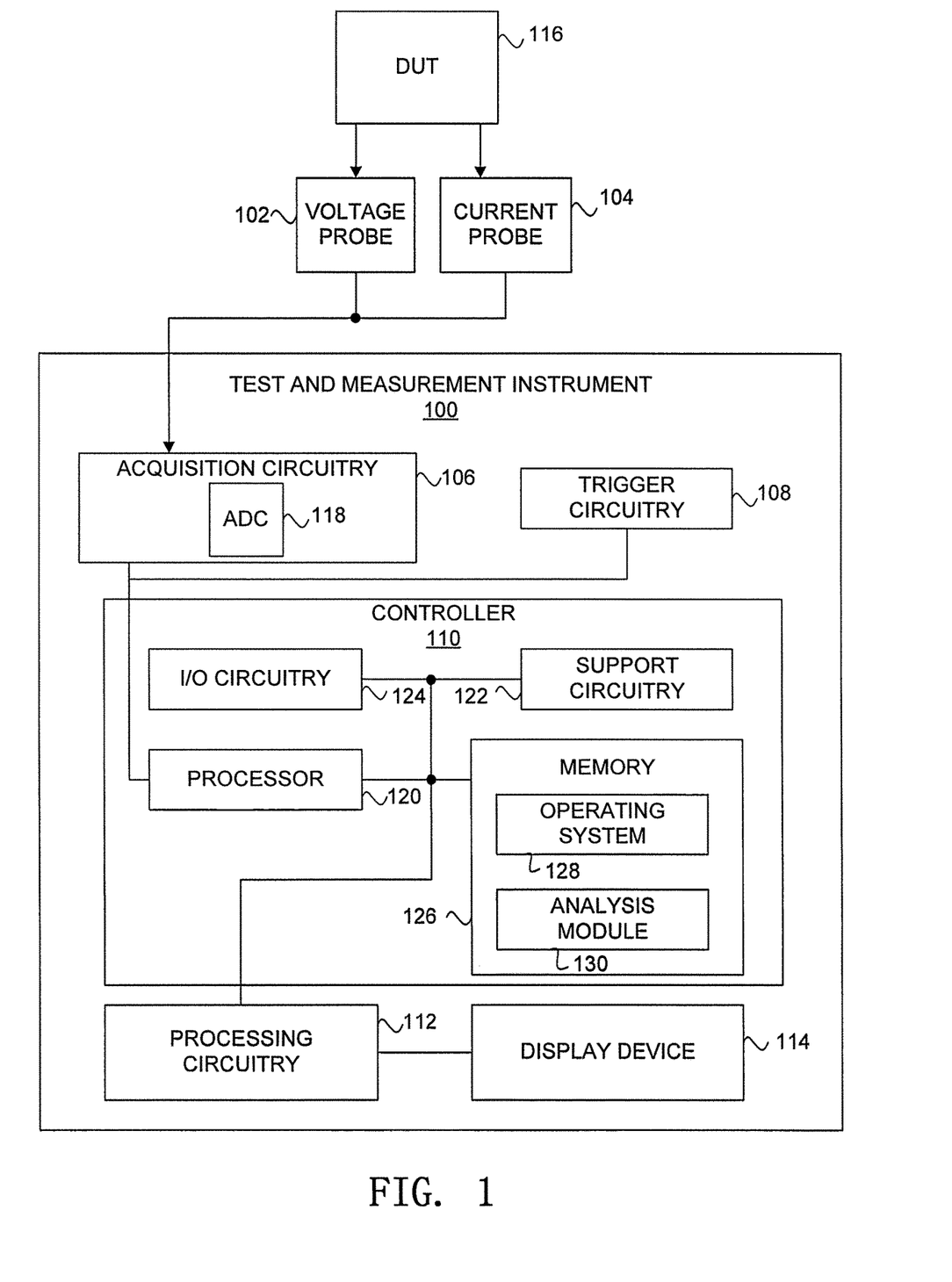
FIG. 1 illustrates a high level block diagram of an exemplary test and measurement instrument.

FIG. 1 depicts a high level block diagram of an exemplary test and measurement instrument having an analysis tool of the disclosed technology. In particular, the test and measurement instrument 100 of the disclosed technology utilizes a voltage probe 102 and a current probe 104, and comprises acquisition circuitry 106, trigger circuitry 108, a controller 110, processing circuitry 112, and a display 114. The voltage probe 102 and current probe 104 may be any conventional voltage or current probes suitable for respectively detecting analog voltage and current signals from the device under test (DUT) 116. The output of the voltage probe 102 and the current to probe 104 are sent to the acquisition circuitry 106.

Acquisition circuitry 106 comprises analog-to-digital converter (ADC) 118. Acquisition circuitry 106 in combination with ADC 118 operates to digitize, at a sample rate, one or more of the signals from the DUT 116 for use by the controller 110 and/or the processing circuitry 112. The acquisition circuitry 106 communicates the resulting sample stream to the controller 110.

The controller 110 operates to process the acquired sample streams provided by the acquisition circuitry 106 to generate respective waveform data associated with the sample streams. That is, given the desired time per division and volts per division display parameters, the controller 110 operates to modify or rasterize the raw data associated with an acquired sample stream to produce corresponding waveform data having the desired time per division and volts per division parameters. The controller 110 may also normalize waveform data having non-desired time per division, volts per division, and current per division parameters to produce waveform data having the desired parameters. The controller 110 provides the waveform data to the processing circuitry 112 for subsequent presentation on the display 114.

The controller 110 includes a plurality of components including at least one processor 120, support circuit 122, input/output (I/O) circuitry 124, memory 126, and one or more communication buses for providing communications between the controller components. The processor 120 cooperates with support circuitry 122, such as power supplies, clock circuits, cache memory, and the like, as well as circuits that assist in executing software routines stored in the memory 126. As such, it is contemplated that some of the process steps discussed herein as software processes may be implemented within hardware, for example, as circuitry that cooperates with the processor 120 to perform various steps. The controller 110 also contains the I/O circuitry 124 that forms an interface between the various function elements communicating with the controller 110.

For example, the I/O circuitry 124 may comprise a keypad, pointing device, touch screen, or other means adapted to provide user input and output to the controller 110. The controller 110, in response to such a user input, adapts the operations of the acquisition circuitry 106 to perform various data acquisitions, processing, display communications, among other functions. The controller 110, also in response such a user input, adapts the operations of the trigger circuitry 108 to perform triggering operations. In addition, the user input may be used to trigger automatic calibration functions and/or adapt other operating parameters of the display 114, logical analysis or other data acquisition devices.

The memory 126 may include volatile memory, such as SRAM, DRAM, among other volatile memories. The memory 126 may also include non-volatile memory devices, such as a disk drive or a tape medium, among others, or programmable memory, such as an EPROM, among others. The memory 126 stores the operating system 128 of the test and measurement instrument 100, and the analysis module 130. The analysis module 130 is used to graphically display on the display 114 a current versus voltage plot 300 of the ON path of a switching device and an OFF path of a switching device, as more full described below. The analysis module 130 is also used to calculate the switching loss of a curve of either the ON path or the OFF path.

Although the controller 110 of FIG. 1 is depicted as a general purpose computer that is programmed to perform various control functions in accordance with the disclosed technology, the disclosed technology may be implemented in hardware such as, for example, an application specific integrated circuit (ASIC). As such, it is intended that the processor 120 described herein be broadly interpreted as being equivalently performed by hardware, software, or a combination thereof.

It will be appreciated by those skilled in the art that standard signal processing components (not shown), such as buffering circuitry, signal conditioning circuitry, and the like are also employed as required to enable the various functions described herein. For example, the acquisition circuitry 106 sample the signals from the DUT 116 at a sufficiently high rate to enable appropriate processing by the controller 110 and/or the processing circuitry 112.

In some embodiments, the trigger circuitry 108 provides a trigger enable signal to a trigger controller (not shown). The trigger enable signal is asserted in response to a determination by circuitry within the acquisition circuit 106 when a desired triggering event, such as a particular sequence of logic levels indicative of a portion of a data word and the like has been received via the signals. The desired triggering event may comprise any combinatorial and or sequential logic function applied to the signals and test received by the acquisition circuitry 106. The specific trigger events are applied to the trigger circuitry 108 via the controller 110.

The processing circuitry 112 includes data processing circuitry suitable for converting acquired signal streams or waveform data into image or video signals, which are adapted to provide visual imagery (e.g., video frame memory, display formatting and driver circuitry, and the like). The processing circuitry 112 may include the display 114 and/or provide output signals suitable for use by an external display 114.

The processing circuitry 112 is optionally responsive to the controller 110 and the various parameters, such as vertical (e.g. volts per division) and horizontal (e.g. time per division) display parameters, as well as user interface imagery (e.g., user prompts, diagnostic information and the like). It will be appreciated by those skilled in the art that within the context of a data acquisition system utilizing acquisition circuitry 106 it is not necessary to include display circuitry and a display 114 in the acquisition circuitry 106. Moreover, in the case of the acquisition circuitry 106 comprising modules or cards inserted within a computing device, or arranged using a back plane, a single display circuit and a display 114 may provide an image processing function for the acquisition circuit 106.

Figure 2:
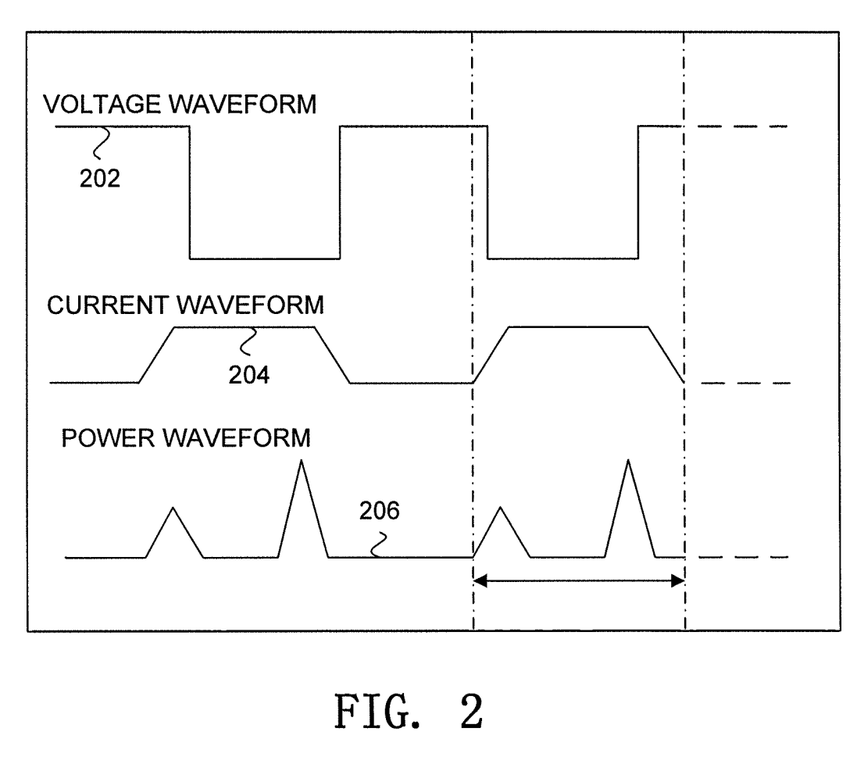
FIG. 2 illustrates examples of waveforms received from a device under test.

FIG. 2 depicts a voltage waveform 202, a current waveform 204, and a power waveform 206 for a DUT 116. A switching cycle occurs when the transistor of the DUT turns on and then turns off. This corresponds to when the current waveform goes high as the voltage waveform goes low as shown in FIG. 2, and then as the current waveform goes low as the voltage wave form goes high. As a DUT 116 is connected to a test and measurement instrument 100, many switching cycles will occur and be recorded in memory 126.

The start and stop of the ON and OFF regions of a power waveform 206 and a transistor are computed in the analysis module 130 using the voltage waveform 202 and the current waveform 204. The voltage and current waveforms are acquired from connecting voltage probe 102 and current probe 104 to the DUT 116. The voltage probe 102 and the current probe 104 are connected to the test and measurement instrument, as discussed above. Sometimes a gate drive signal is also provided to amplify the signals received from the DUT 116.

As shown in FIG. 3, the current and voltage of an ON path 302 and the current and voltage of an OFF path 304 are graphically displayed on a current versus voltage plot 300 on display 114. FIG. 3 shows graphically displaying the ON path 302 and the OFF path 304 for a switching device during a single switching cycle. The ON path 302 shows when the transistor of the power switching supply turns on. Initially, as can be seen in FIG. 3, during the ON state, the voltage is high and the current is low. As the transistor is switched on, the current goes high as the voltage goes low. The OFF path 304 shows when the transistor of the power switching supply is turning off. As can be seen in FIG. 3, initially the current is high and the voltage is low. As the transistor is switched off, the current goes low as the voltage goes high, opposite from the ON path 302.

Figure 4:
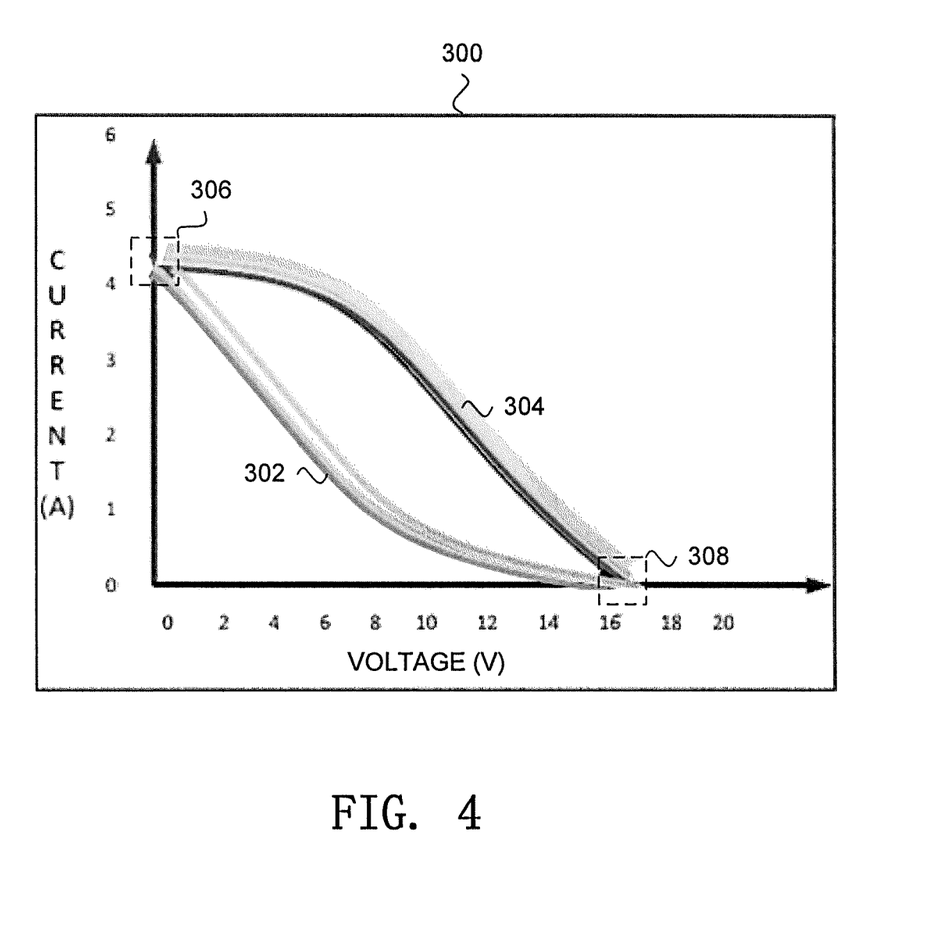
FIG. 4 illustrates an idealized current versus voltage plot of certain embodiments of the disclosed technology.
Figure 5:
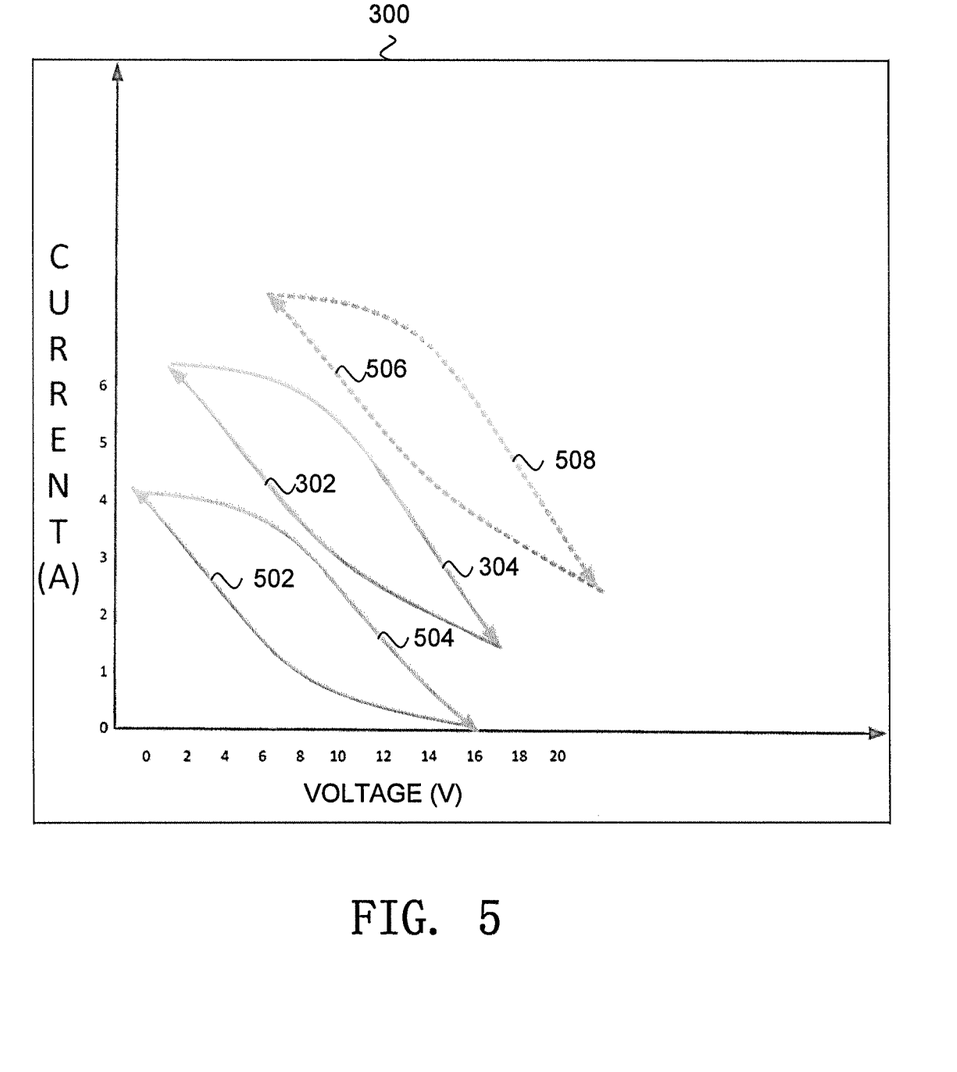
FIG. 5 illustrates an idealized current versus voltage plot of certain embodiments of the disclosed technology.

FIG. 4 illustrates multiple switching loss graphs for multiple switching cycles which would be displayed on display 114. FIG. 4 illustrates only the switching cycles at a steady state operation. FIG. 5 illustrates switching cycles when a DUT 116 is turned on, as would be displayed on the display 114. Paths 502 and 504 depict when the DUT 116 is initially turned on. Paths 506 and 508 depicts the increase in current and voltage in the initial switching cycles of the transistor. Finally, paths 302 and 304 depicts when the device has entered a steady state operation. This allows a user to see the response of the switching device with the DUT 116 is initially turned on.

A user of the test and measurement instrument 100 with the analysis module 130 is able to view the behavior of the switching device over a period of time since each switching cycle is rendered and overlapped on a current versus voltage plot 300, as shown, for example, in FIG. 4. Further, a user is able to determine the switching transients 306 and a diode reverse recovery current, or negative current region, 308 from looking at the graph of the ON path and the OFF path.

Figure 6:
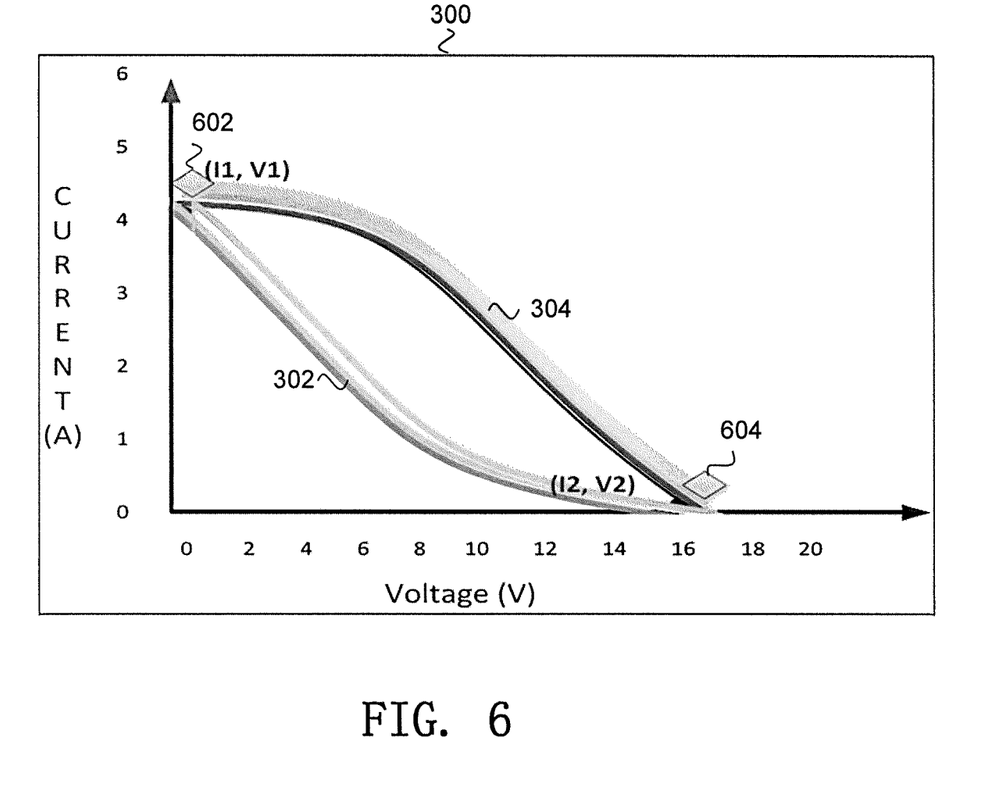
FIG. 6 illustrates an idealized current versus voltage plot of certain embodiments of the disclosed technology.

The current and voltage plot 300s shown in FIGS. 3-6 are interactive with a user via the I/O circuitry 124. The plot will allow a user to place a cursor, such as cursor-1 602 shown in FIG. 6, on a scalar value on the current versus voltage plot 300. When a scalar value is selected, the resulting curve will be highlighted by the plot cursors, cursor-1 602 and cursor-2 604 as shown in FIG. 6. When selected, the display 114 may show next to the cursors the current and voltage associated with the points selected by the user, as seen in FIG. 6. The analysis module 130 is then capable of calculating the switching loss between the two cursors. Accordingly, a user is capable of placing a cursor on the worst case portions of the graph to understand what is going on at that point. The device then display which switching cycle relates to that point on the graph.

A user is also able, through the I/O circuitry 124, to jump from one switching cycle to the next switching cycle using "next" and "previous" buttons on the test and measurement instrument 100 (not shown). This allows a user to easily view a variety of switching cycles near each other to determine what is happening on the DUT 116.

A user may also specify a specific switching cycle or cycles to view on the display 114 through the I/O circuitry 124. A user can specify to view switching cycle #500 to switching cycle #550, for example. Then, only those specific switching cycles are displayed on the current versus voltage plot 300. Further, a user may choose to only view the ON paths 302 or the OFF paths 304 via the I/O circuitry 124. In response, only the selected type of paths would be displayed on display 114.

Figure 7:
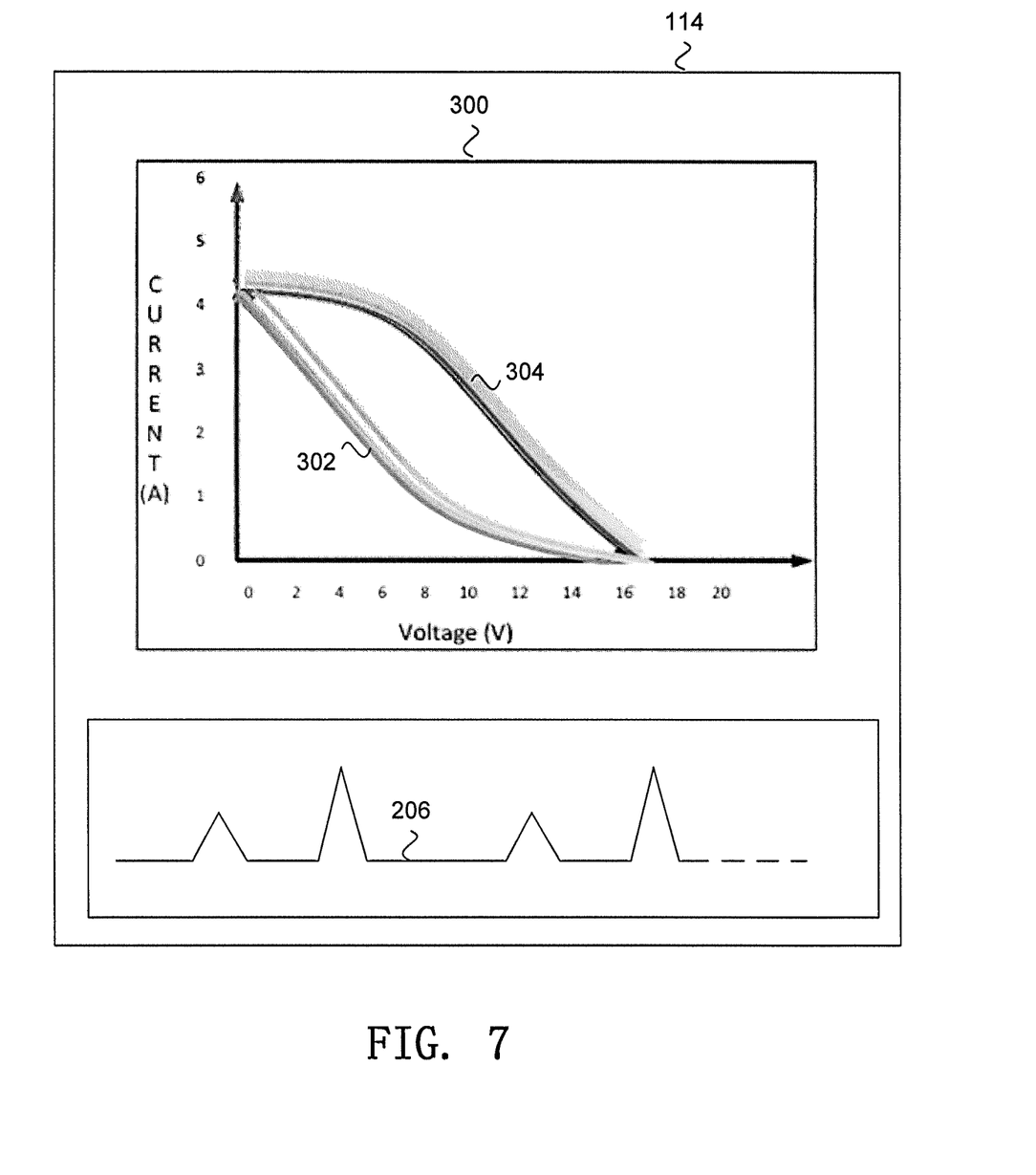
FIG. 7 illustrates an idealized display with a current versus voltage plot and power waveform according to other embodiments of the disclosed technology.

As shown in FIG. 7, the display 114 may display both the current versus voltage plot 300 along with the power waveform 206. A user can select this feature using the I/O circuitry 124.

A mask may also be provided by a user or by the controller to the trigger circuitry 108. A fail status can be provided by the trigger circuitry 108 if any of the switching loss limits set by the user or the controller are violated. A pass status would be provided when the values are within the switching loss limits.

Figure 8:
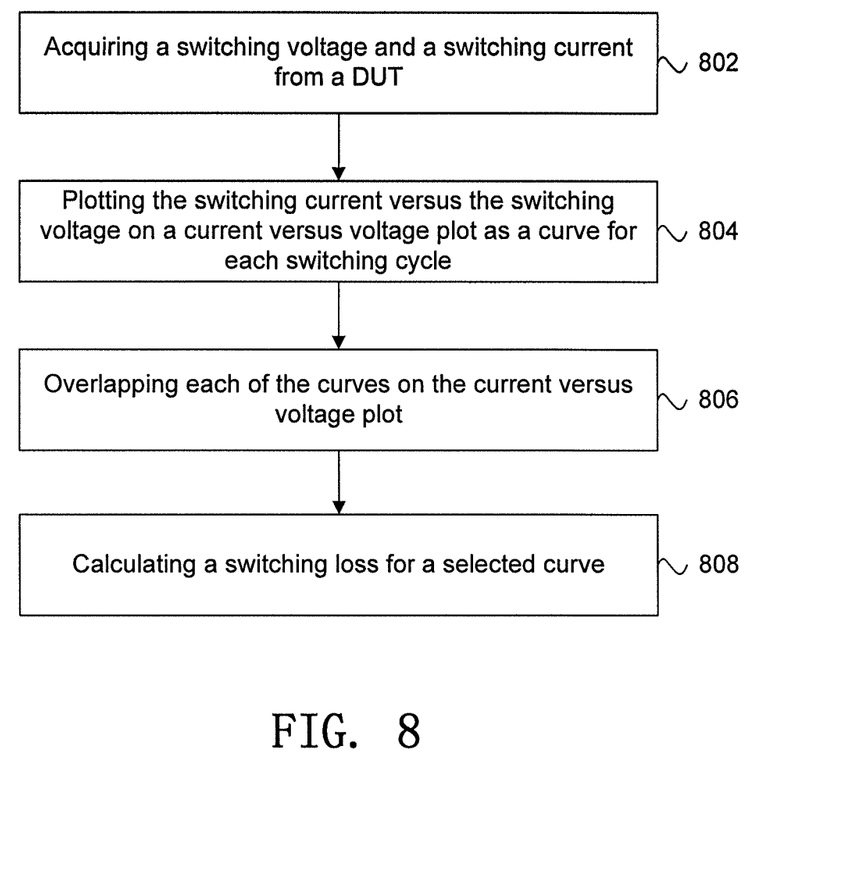
FIG. 8 illustrates a method of plotting a current versus voltage plot of the disclosed technology.
Figure 9:
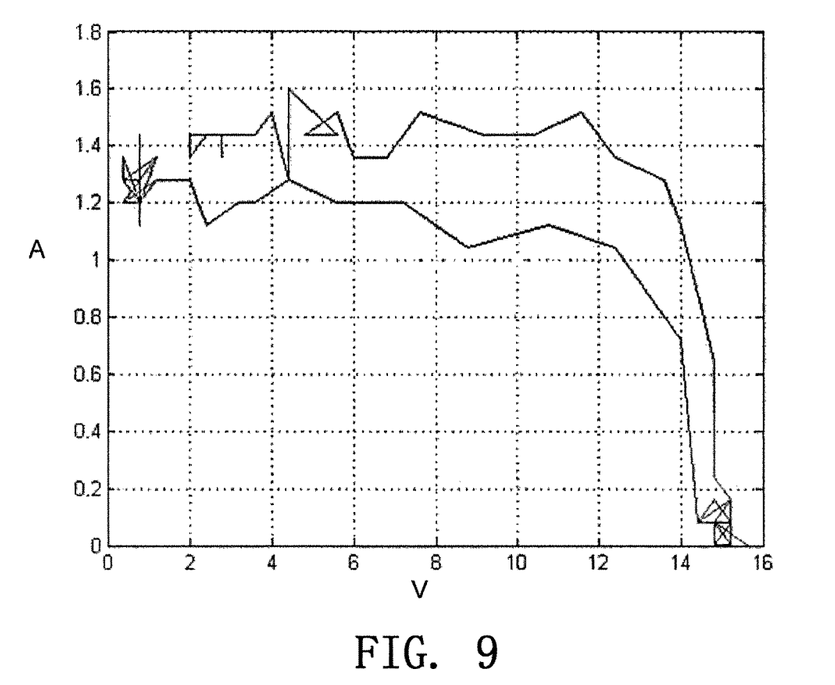
FIG. 9 shows a real-time simulation of FIG. 3.
Figure 10:
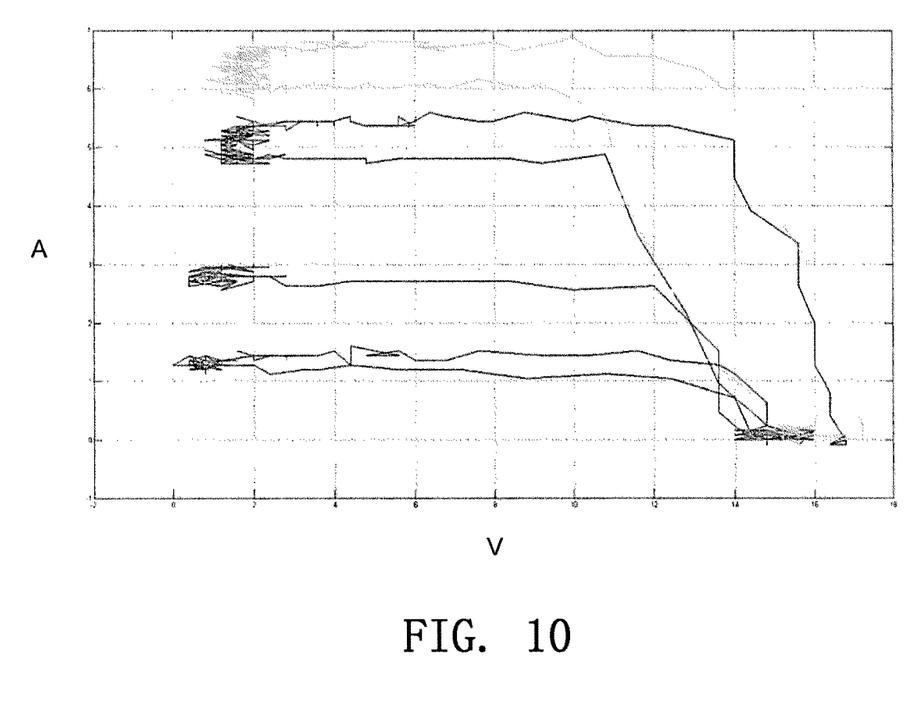
FIG. 10 shows a real-time simulation of FIG. 5.
Figure 11:
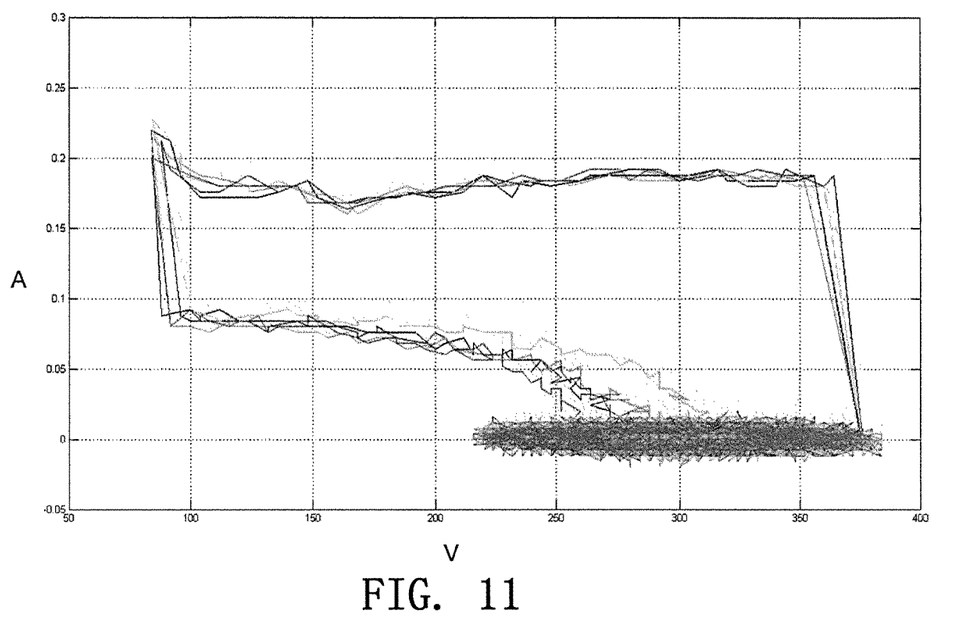
FIG. 11 shows a real-time simulation of FIG. 4.
Figure 12:
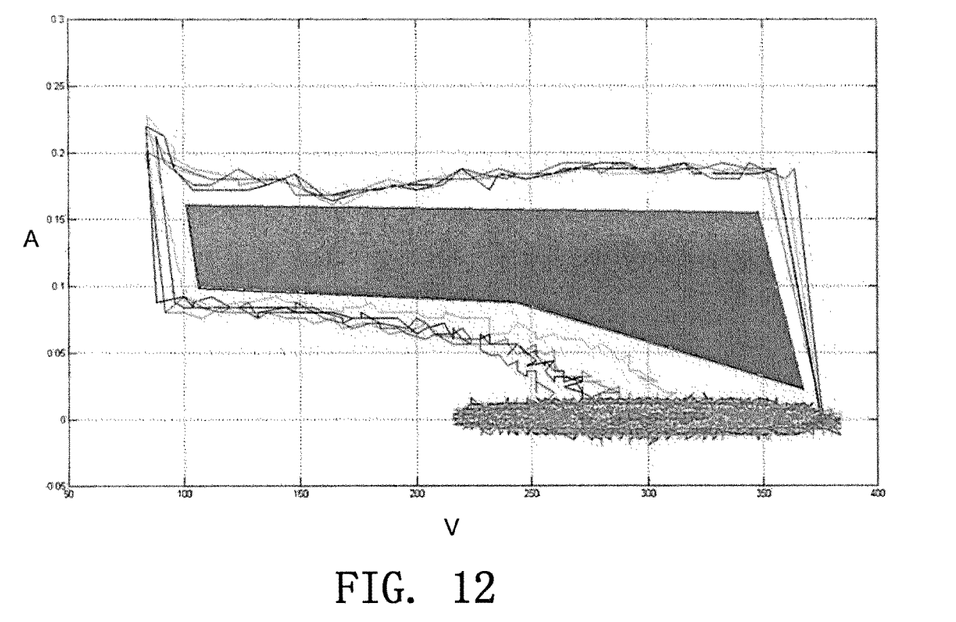
FIG. 12 shows a real-time simulation of FIG. 4 with the use of a mask.

FIG. 8 shows the method for graphically displaying an ON path and an OFF path of the switching device. Initially, in step 802, the switching voltage and switching current are acquired from DUT 116 via voltage probe 102 and current probe 104, respectively, for a plurality of switching cycles of the DUT 116. In step 804, the analysis module 130 plots the switching current versus the switching voltage received on a current versus voltage plot 300 as a curve for each of the switching cycles. Then, each of the curves on the current versus voltage plot 300 are overlapped instep 806. The current versus voltage plot 300 is then displayed with all of the curves. As one of ordinary skill in the art will understand, the test and measurement instrument can graphically display the ON path and OFF path in real time. Therefore, every switching cycle a new curve is overlapped on the existing curves on the current versus voltage plot 300. In step 808, the analysis module 130 calculates a switching loss for a specific selected curve.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:
1. A method for a test and measurement instrument of verifying operation of a switching device comprising:
   acquiring, by the test and measurement instrument, from the switching device, a switching voltage and a switching current via a voltage probe and a current probe, respectively, for a plurality of switching cycles of the switching device;
   determining an ON region and an OFF region of a power waveform based on the switching voltage and the switching current;
   determining a switching cycle curve for a current versus voltage plot including an ON path and an OFF path based on the ON region and the OFF region for each switching cycle of the switching device based on the power waveform;
   plotting the switching cycle curve for each of the switching cycles;
   overlapping each of the switching cycle curves on the current versus voltage plot;
   displaying the current versus voltage plot with the overlapping switching cycle curves;
   indicating a pass or fail status of the switching device based on a mask applied to the current versus voltage plot;
   receiving a selection from a user of a point within the current versus voltage plot; and
   highlighting on the current versus voltage plot a specific curve of the overlapping switching cycle curves associated with the point.

2. A method as claimed in claim 1, including calculating a switching loss value of the specific curve.

3. A method as claimed in claim 1, including:
   displaying in a first window of the display the current versus voltage plot; and
   displaying in a second window of the display the power waveform generated from the switching voltage and the switching current.

4. A method as claimed in claim 1, including:
receiving an input to display only a portion of the plurality of switching cycles; and
displaying in response to the input only the portion of the plurality of switching cycles.

5. A method as claimed in claim 1, wherein plotting the switching current versus the switching voltage for each of the switching cycles includes plotting an ON path of each switching cycle and plotting an OFF path of each switching cycle, such that an eye is formed on the current versus voltage plot, and wherein the mask defines an area within the eye that indicates switching loss limits for the switching device.

6. A test and measurement instrument including:
an acquisition unit structured to receive a switching voltage and a switching current for a plurality of switching cycles of a device under test;
a controller structured to:
determine an ON region and an OFF region of a power waveform based on the switching voltage and the switching current,
determine a switching cycle curve for a current versus voltage plot including an ON path and an OFF path based on the ON region and the OFF region for each switching cycle of the switching device based on the power waveform, and
plot the switching current as a function of the switching voltage on the current versus voltage plot for each switching cycle curve, such that each point of the current versus voltage plot represents both a current value and a voltage value, wherein the plot forms a plurality of switching cycle curves that overlap on the current versus voltage plot;
a display structured to display the current versus voltage plot to enable a user of the test and measurement instrument to identify a switching transient or a negative current region associated with the switching cycles; and
an input unit structured to receive a selection from the user of a point on a specific curve of the plurality of curves, wherein the controller is further structured, in response to the selection, to highlight on the current versus voltage plot the specific curve.

7. A test and measurement instrument as claimed in claim 6, wherein the controller is structured to display in a first window of the display the current versus voltage plot and display in a second window of the display a power waveform generated from the switching voltage and the switching current.

8. A test and measurement instrument as claimed in claim 6, wherein the controller is further structured to calculate a switching loss value of the specific curve and cause the switching loss value to be displayed to the user via the display.

9. A test and measurement instrument as claimed in claim 6, including an input unit structured to receive a selection from the user of a subset of the plurality of switching cycles, and wherein the controller is structured to cause only the subset of the plurality of switching cycles to be plotted on the current vs voltage plot, in response to the selection.

10. A test and measurement instrument as claimed in claim 6, wherein the controller is structured to indicate a pass or fail status of the device under test based on a mask applied to the current versus voltage plot.

11. One or more non-transitory computer-readable media having instructions embodied thereon, which, when executed by a processor of a test and measurement instrument cause the test and measurement instrument to:
receive a switching voltage and a switching current for a plurality of switching cycles of a device under test;
determine an ON region and an OFF region of a power waveform based on the switching voltage and the switching current;
determine a switching cycle curve for a current versus voltage plot including an ON path and an OFF path based on the ON region and the OFF region for each switching cycle of the switching device based on the power waveform;
plot the switching current as a function of the switching voltage for each switching cycle curve on the current versus voltage plot, such that each point of the current versus voltage plot represents both a current value and a voltage value, and each plot of the plurality of switching cycle curves forms a plurality of switching cycle curves that overlap in the current versus voltage plot;
output the current versus voltage plot to a display of the test and measurement instrument for presentation to a user of the test and measurement instrument to enable the user to evaluate an aggregate switching loss of the plurality of switching cycles;
receive input from the user selecting a specific curve of the plurality of curves, the specific curve being associated with a specific switching cycle;
calculate a switching loss value of the specific curve; and
output the switching loss value to the display for presentation to the user to enable the user to evaluate a switching loss of the specific switching cycle.

12. The one or more non-transitory computer-readable media of claim 11, wherein the switching loss value is a first switching loss value, and wherein the instructions, when executed by the test and measurement instrument further cause the test and measurement instrument to:
receive additional input from the user indicating that the user would like to view an adjacent curve associated with an adjacent switching cycle that is adjacent in time to the specific switching cycle;
calculate a second switching loss value of the adjacent curve; and
output a graphical depiction of the adjacent curve and the second switching loss value to the display for presentation to the user to enable the user to evaluate a switching loss of the adjacent switching cycle.

13. The one or more non-transitory computer-readable media of claim 11, wherein the instructions, when executed by the test and measurement instrument, further cause the test and measurement instrument to:
receive additional input from the user indicating that the user would like to analyze a selected group of the plurality of switching cycles;
update the current versus voltage plot to include only those curves associated with the selected group;
output a graphical depiction of the updated current versus voltage plot to the display for presentation to the user to enable the user to evaluate a switching loss of the selected group.

14. The one or more non-transitory computer-readable media of claim 11, wherein the voltage versus current plot enables the user to identify a switching transient or a negative current region associated with the plurality of switching cycles.

15. The one or more non-transitory computer-readable media of claim 11, wherein the instructions, when executed by the test and measurement instrument, further cause the test and measurement instrument to:
  apply a mask to the current versus voltage plot, the mask representing switching loss limits set by the user;
  detect a violation of the mask by at least one curve of the plurality of curves; and
  output a fail status for the device under test, in response to detecting the violation of the mask.

* * * * *